United States Patent [19]
Kobayashi

[11] Patent Number: 5,387,880
[45] Date of Patent: Feb. 7, 1995

[54] COMPACT MONOLITHIC WIDE BAND HEMT LOW NOISE AMPLIFIERS WITH REGULATED SELF-BIAS

[75] Inventor: Kevin W. Kobayashi, Torrance, Calif.

[73] Assignee: TRW Inc., Redondo Beach, Calif.

[21] Appl. No.: 105,521

[22] Filed: Oct. 20, 1993

[51] Int. Cl.⁶ .............................................. H03F 3/16
[52] U.S. Cl. .................................... 330/296; 330/277
[58] Field of Search ............. 330/277, 286, 296, 307, 330/310, 311, 253, 261, 292

[56] References Cited

U.S. PATENT DOCUMENTS

| | | | |
|---|---|---|---|
| 4,912,430 | 3/1990 | Frank | 330/277 |
| 4,990,973 | 2/1991 | Ishikawa et al. | 330/296 X |
| 5,010,588 | 4/1991 | Gimlett | 330/311 X |
| 5,083,095 | 1/1992 | Madaffari | 330/310 X |
| 5,130,667 | 7/1992 | Chang et al. | 330/253 |

Primary Examiner—Steven Mottola

[57] ABSTRACT

Monolithic regulated self-bias circuits for High Electron Mobility Transistor (HEMTs) integrated circuit applications provide reliable performance which can withstand wide HEMT threshold voltage variation (±5 V). The threshold voltage variations are inherent with HEMT devices due to the nature of HEMT process fabrication and material growth properties. Three regulated self-bias circuits are disclosed: active regulated negative current source bias; active regulated positive current source bias; resistive self-bias connected to a cascode source-follower amplifier. The positive and negative regulated current source bias can also be connected with HEMT low noise amplifiers.

33 Claims, 8 Drawing Sheets

COMPACT MONOLITHIC WIDE BAND HEMT LOW NOISE AMPLIFIERS WITH REGULATED SELF-BIAS

BACKGROUND OF THE INVENTION

1. Technical Field

This invention relates to regulated self-bias circuits connected to circuits including a High Electron Mobility Transistor (HEMT) and, more particularly, to monolithic regulated self-biased circuits for low noise HEMT amplifiers.

2. Discussion

As gate geometries for low-noise Gallium Arsenide (GaAs) Field-Effect Transistors approach a lower size limit (approximately 0.25 micrometers), performance also approaches a limit. High Electron Mobility Transistors (HEMTs) have superior performance and can be fabricated on GaAs. A carrier transport mechanism of the HEMT resembles transport within undoped GaAs which has little impurity scattering. The structure of the HEMT is similar to a GaAs Metal Semi-conductor Field-Effect Transistor (MESFET), utilizing a hetero junction between GaAs and Aluminum Gallium Arsenide (AlGaAs). The HEMT have almost twice the carrier velocity and mobility of a MESFET, resulting in a higher cutoff frequency and lower noise figure.

Most communication systems utilize receivers requiring low noise amplifiers. HEMT have low noise characteristics and have been used in the communication receivers. However, threshold voltages of the HEMT are difficult to control and vary due to an inherent physical nature of the HEMT device process fabrication and material growth. In addition to material and process variations, the HEMT threshold voltage will also vary with temperature and age. Conventional receivers using HEMT devices currently require an off-chip threshold voltage regulator tolerant of the threshold voltage variations which adversely impacts chip size and cost.

Combining a self-bias regulation circuit with a HEMT amplifier or other types of HEMT integrated circuit functions in a microwave monolithic integrated circuit (MMIC) is desirable. A common goal for any monolithic circuit is to use design and fabrication techniques to reduce chip size, increase ease of implementation, and reduce costs in high volume production. These design and fabrication techniques should not compromise performance, and if possible, should improve performance.

SUMMARY OF THE INVENTION

In accordance with the present invention, a bias regulating circuit for generating a negative current at a source of a first HEMT includes second and third HEMTs monolithically integrated with the first HEMT and including a gate, a source, and a drain. The source of the third HEMT is connected to the source of the second HEMT. A gate resistor has one end connected to the gate of the third HEMT. A first resistor has one end connected to the drain of the third HEMT and an opposite end connected to a gate of the first HEMT. A second resistor has one end connected to an opposite end of the gate resistor and an opposite end connected to the source of the first HEMT. A reference resistor has one end connected to an opposite end of the gate resistor and an opposite end connected to a second voltage source for providing a negative current source. One end of a second load resistor is connected to the drain of the third HEMT for providing closed loop voltage gain.

In another embodiment of the present invention, a bias regulating circuit generates a positive current at a drain of a first HEMT. The bias regulating circuit includes second and third HEMT monolithically integrated with the first HEMT and including a gate, a source and a drain. The source of the second HEMT is connected to the source of the third HEMT. A buffer HEMT monolithically integrated with the first HEMT includes a gate, a source and a drain. The gate of the buffer HEMT is connected to the drain of the second HEMT. A voltage divider network includes first and second resistors. One end of the first resistor is connected to the source of the buffer HEMT and an opposite end of the first resistor is connected to said one end of said second resistor. A first gate resistor has one end connected to the gate of the third HEMT. A second gate resistor has one end connected to the opposite end of the first resistor and an opposite end connected to the gate of the first HEMT.

Other objects, features and advantages will be readily apparent.

BRIEF DESCRIPTION OF THE DRAWINGS

The various advantages of the present invention will become apparent to those skilled in the art after studying the following specification and by reference to the drawings in which.

DESCRIPTION OF THE PREFERRED EMBODIMENT

Figure 1:
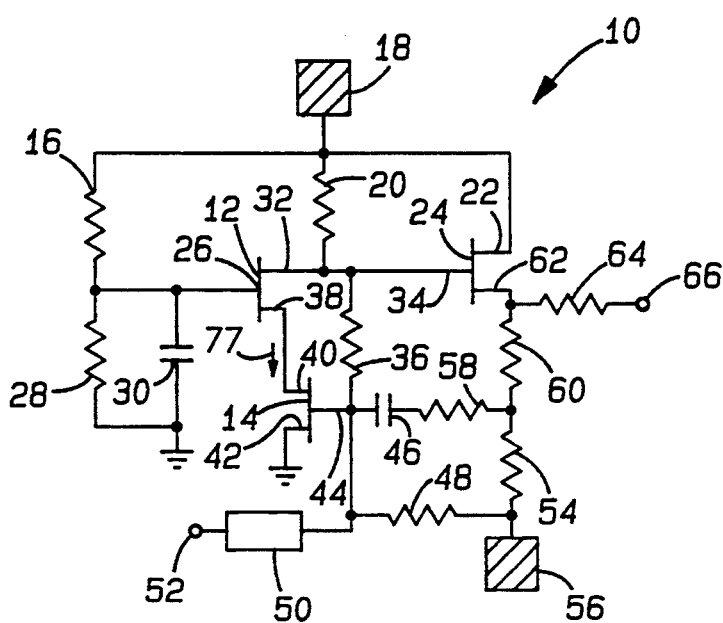
FIG. 1 is an electrical schematic of a low noise, resistive self biased high electron mobility transistor (HEMT) amplifier according to a first embodiment of the present invention.

In FIG. 1, a low noise, resistive self-biased HEMT amplifier 10 which is tolerant of threshold voltage variations is shown. The amplifier 10 includes first and second HEMTs 12 and 14. A gate bias resistor 16 is connected to a voltage source 18, a load resistor 20, and a drain 22 of a third HEMT 24. The bias resistor 16 is also connected to a gate 26 of the first HEMT 12, a gate bias resistor 28, and a bypass capacitor 30. The gate bias resistor 28 and the bypass capacitor 30 are connected to ground.

The load resistor 20 is connected to a drain 32 of the first HEMT 12, to a gate 34 of the third HEMT 24 and to a resistor 36. A source 38 of the first HEMT 12 is connected to a drain 40 of the second HEMT 14. A source 42 of the second HEMT 14 is connected to ground. The resistor 36 is connected to a gate 44 of the second HEMT 14, a blocking capacitor 46, a resistor 48, and a microstrip transmission line 50. An input node 52 is connected to the microstrip transmission line 50.

The resistor 48 is connected to a resistor 54 and a voltage source 56 (which can be, for example, a voltage having the same amplitude but opposite polarity of the voltage source 18). The resistor 54 is connected to resistors 58 and 60. The resistor 60 is connected to a source 62 of the third HEMT 24 and to a matching resistor 64. The matching resistor 64 is connected to an output node 66.

The first and second HEMTs 12 and 14 are connected as a first-stage cascode pair. A voltage divider network defined by the bias resistors 16 and 28 generates a gate bias voltage for the first HEMT 12. The bypass capacitor 30 provides a bypass path around the bias resistors 16 and 28. A voltage gain of the first-stage cascode pair is related to a resistance value of the load resistor 20. The third HEMT 24 is connected as a source-follower which buffers the first-stage cascode pair and provides matching for the output node 66. The matching resistor 64 in series with the output node 66 provides additional matching of the output node 66 to a 50 ohm impedance.

Since the gain of the first-stage cascode pair is high, noise of the HEMT amplifier 10 is not significantly impacted by the matching resistor 64. The resistors 54 and 60 provide current for biasing the third HEMT 24. Performance of the HEMT amplifier 10 is not very sensitive to the bias of the third HEMT 24.

The resistor 58 and the blocking capacitor 46 complete a feedback path to the input or gate 44 of the second HEMT 14. A capacitance value of the blocking capacitor 46 determines a lower frequency limit of the HEMT amplifier 10. Gain, noise, and input return-loss performance can be adjusted by varying a resistance value of the resistor 58.

The microstrip transmission line 50 provides input inductance to improve matching between the HEMT amplifier 10 and an input circuit attached to the input node 52. The resistors 36 and 48 in conjunction with the load resistor 20 provide self-regulating bias through negative feedback. As a drain current through the first and second HEMTs 12 and 14 increases, a voltage drop across the load resistor 20 increases. Voltage at the drain 32 of the first HEMT 12 decreases causing a decrease in a voltage (defined by a voltage divider including the resistors 36 and 48) at the gate 44 of the second HEMT 14. A decrease in the voltage at the gate 44 of the second HEMT 14 decreases the drain current through the first and second HEMTs 12 and 14. A percentage variation from a nominal operating current is determined from a ratio of a threshold voltage variation divided by voltage drop across the load resistor 20. Typical percentage variations are on the order of 10%.

Figure 2A:
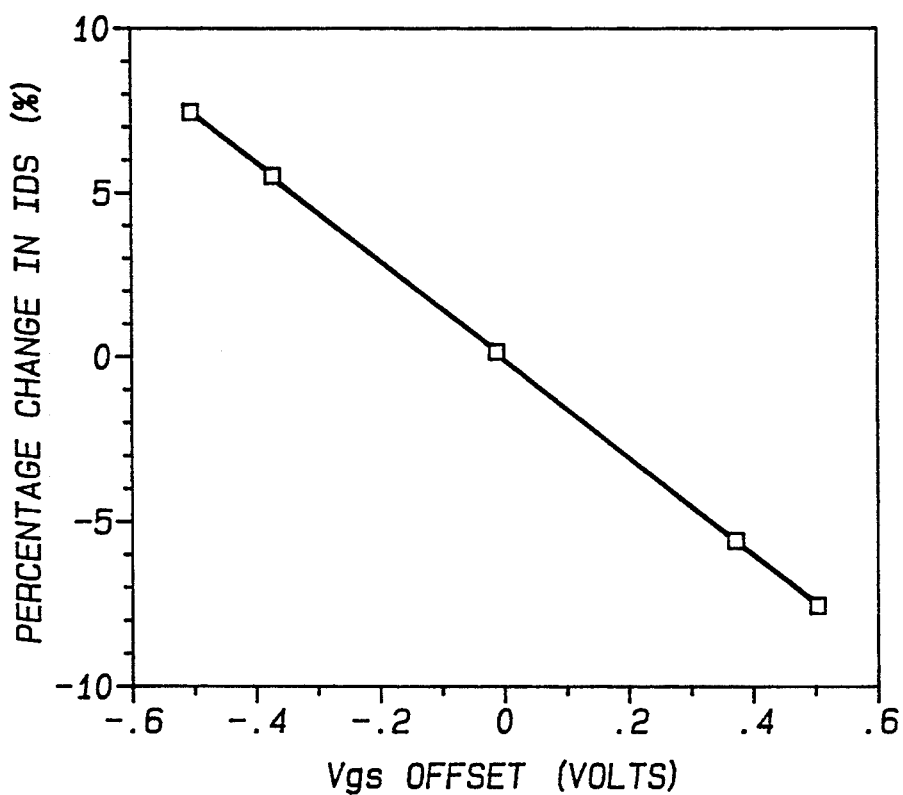
FIG. 2A is a graph of percent variation of regulated bias current as a function of variation in threshold voltage for the resistive self-bias HEMT amplifier of FIG. 1.

FIG. 2A illustrates a simulated percentage change in a nominal bias current $I_{67}$ ($I_{ds}$) indicated by arrow 67 of the resistive self-biased amplifier 10 in FIG. 1 as a function of a threshold offset voltage of the HEMT transistor. The current can be regulated to within $\pm 10\%$ of the nominal bias current $I_{ds}$ for a $\pm 0.5$ volt variation about the nominal threshold voltage. The threshold variation of the HEMT is related to the inherent physical nature of the HEMT device fabrication process and material growth. The resulting variation in the threshold voltage presents a need for self-biasing schemes. A relationship between percentage current regulation as a function of these threshold variations and design parameters such as supply voltage and resistor values is given below:

$$\frac{\Delta I_{ds}}{I_{ds}} = \frac{\Delta V_{gs} g_{m14}}{I_{ds}\left[1 + g_{m14}\left\{R_{20}\left(\frac{R_{48}}{R_{36} + R_{48}}\right)\right\}\right]} \quad [1]$$

where $\Delta V_{gs}$ is the threshold variation of the HEMT transistors, $I_{ds}$ is the nominal bias current, gm14 is a transconductance of HEMT amplifying transistor to be self-biased, $R_{48}$ is a resistance value of the gate shunt bias resistor 48, $R_{20}$ is a resistance value of the load resistor 20, $R_{36}$ is a resistance value of the parallel feedback resistor 36, and $\Delta I_{ds}$ is change in $I_{ds}$ due to change in threshold voltage $\Delta V_{gs}$. The percentage change in $I_{ds}$ is then equal to:

$$\% \text{ change } I_{ds} = \frac{\Delta I_{ds}}{I_{ds}} \times 100 \quad [2]$$

Figure 2B:
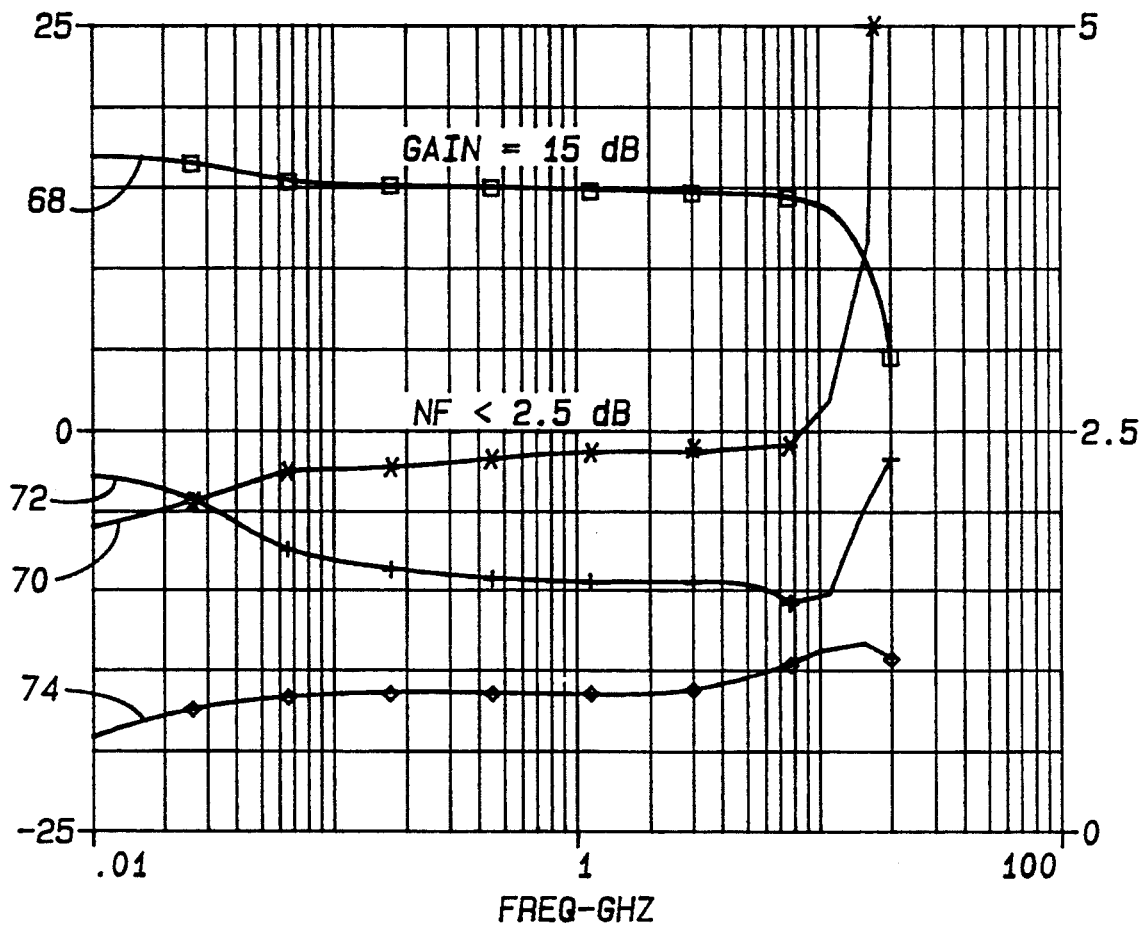
FIG. 2B is a graph of gain, noise figure and return-loss performance of the HEMT amplifier of FIG. 1 as a function of frequency.

In FIG. 2B, gain, noise figure, and return-loss performance of the HEMT amplifier 10 is simulated. A gain curve 68 illustrates stable gain over a bandwidth from 50 MHz to 10 GHz. The lower frequency threshold of the bandwidth is determined by the capacitance value of the capacitor 46. A nominal gain of the amplifier 10 is 15 dB and the noise figure (curve 70) is less than 2.5 dB. Lower noise and higher gain can be obtained by sacrificing bandwidth.

Return-loss is a measure of matching of a node to a 50 ohm impedance. A return-loss curve 72 illustrates matching between the input node 52 of the amplifier 10 and a 50 ohm impedance and a return-loss curve 74 depicts matching between the output node 66 of the amplifier 10 and a 50 ohm impedance. A return-loss of approximately −10 dB or lower is typically considered good.

FIGS. 3-7 illustrate an alternate bias regulating circuit for generating a negative current at a source of a HEMT according to to a second embodiment of the present invention. For clarity purposes, reference numbers from FIG. 1 will be used where appropriate.

Figure 4:
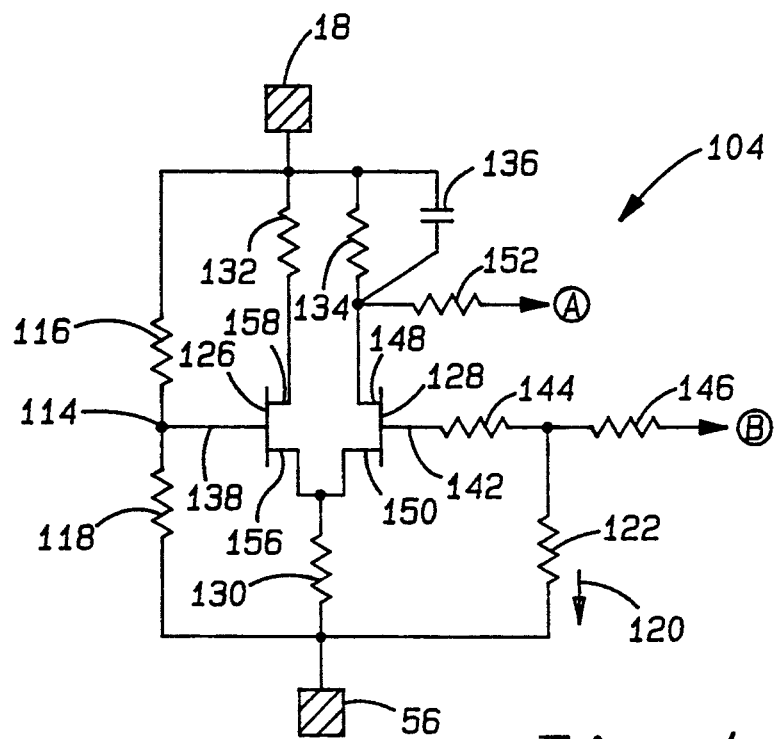
FIG. 4 is a detailed schematic of the bias regulating circuit of FIG. 3.
Figure 5:
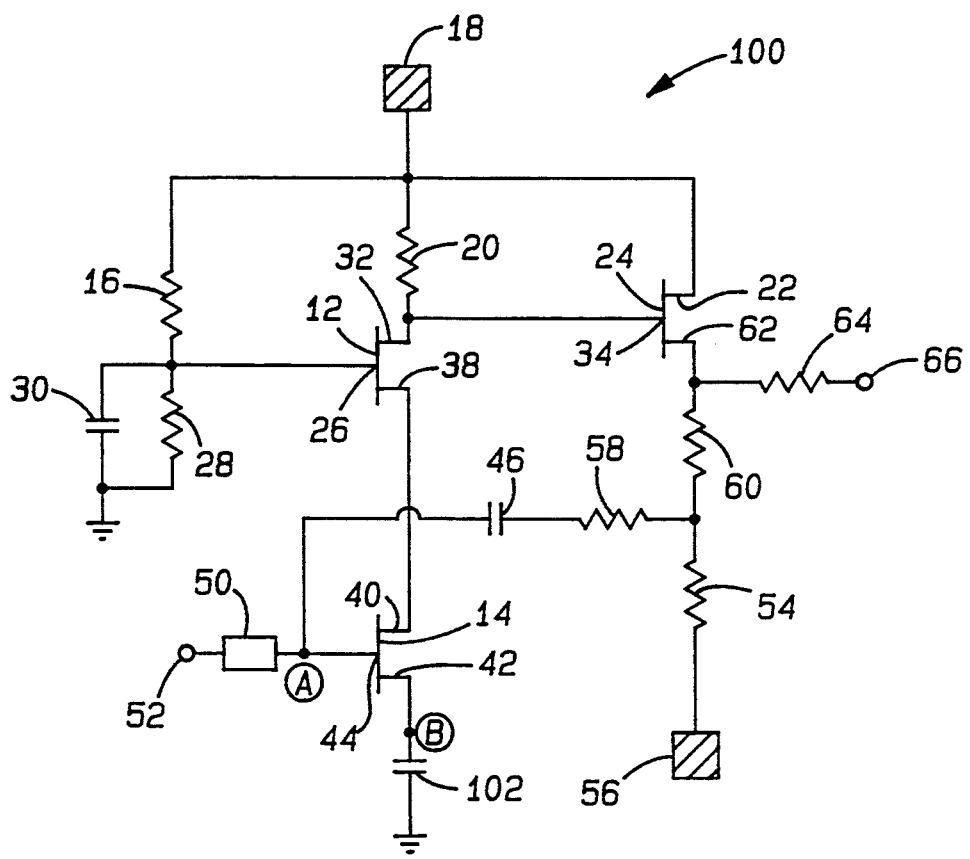
FIG. 5 is an electrical schematic of a HEMT amplifier which is connected to the bias regulating circuit of FIG. 4.

Referring to FIG. 5, a bypass capacitor 102 is connected to the source 42 of the second HEMT 14 and provides an AC ground for a HEMT amplifier 100 and bypasses a bias regulating circuit 104 shown in FIG. 4. The bias regulating circuit 104 is connected to the HEMT amplifier 100 at nodes "A" and "B".

Figure 3:
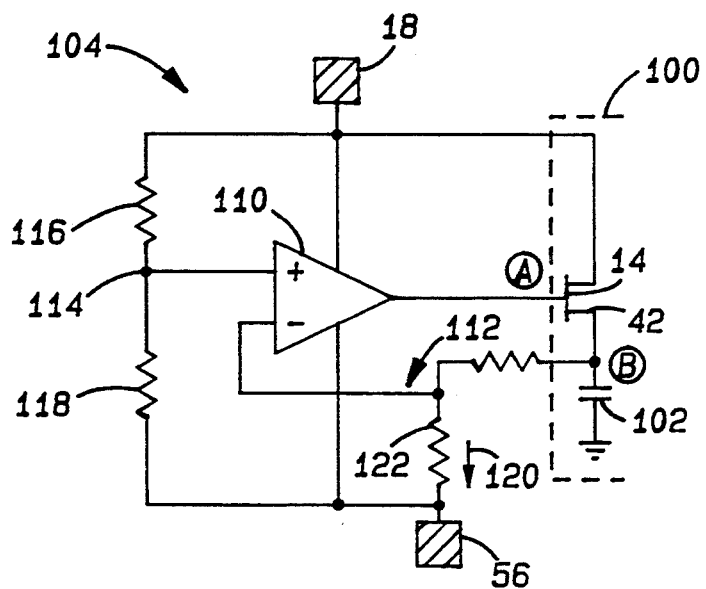
FIG. 3 is a simplified electrical schematic of a bias regulating circuit for generating a negative current at a source of a HEMT according a second embodiment of the present invention.

In FIG. 3, a simplified electrical schematic of the bias regulating circuit 104 of FIG. 4 is shown. A HEMT pseudo-operational amplifier 110 has a negative feedback path 112. A regulated reference voltage at node 114 is defined by a voltage divider network including resistors 116 and 118. A regulated negative current in a direction of arrow 120 is equal to:

$$I_{120} = \frac{(V_{REF} - V_S)}{R_{REF}} \quad [3]$$

where $V_{REF}$ is equal to the voltage at node 114, $V_s$ is equal to a voltage of the voltage source 56, and $R_{REF}$ is equal to the resistance value of the reference resistor 122. As can be appreciated, the bias regulation circuit 104 is a negative current source which provides the current (arrow 120) at the source 42 of the HEMT 14.

In FIG. 4, the bias regulating circuit 104 is shown in greater detail. The HEMT pseudo-op-amp circuit 110 of the simplified electrical schematic of FIG. 3 includes a differential transistor pair including fourth and fifth HEMTs 126 and 128, a current source resistor 130, and first and second load resistors 132 and 134. A voltage gain of the differential pair is set by $(g_m) \cdot (R_L)$ where $R_L$ is equal to the resistance value of the load resistors 132 (assuming the resistor 132 has the same resistance value as the resistor 134).

The higher the gain of the differential pair, the less sensitive the bias regulating circuit 104 is to threshold voltage variations. A capacitor 136 is optional and provides frequency compensation for the differential transistor pair. A reference voltage at a gate 138 of the HEMT 126 (also the node 114) is determined by a voltage divider network defined by the resistance values of the resistors 116 and 118. Because of the negative feedback orientation of the differential transistor pair (the HEMTs 126 and 128), the differential transistor pair adjusts current through the resistors 132 and 134 such that a voltage at the gate 142 of the fifth HEMT 128 is approximately equal to a voltage at the gate 138 of the fourth HEMT 126.

Since there is negligible gate current through a gate 142 of the fifth HEMT 128 (less than 10 micro-amps), there is a negligible voltage drop across a resistor 144. Consequently, the regulated reference voltage is applied at one end of the reference resistor 122. The reference current I indicated by the arrow 120 is defined above in conjunction with FIG. 3. A resistor 146 provides a voltage drop across a drain 148 and a source 150 of the fifth HEMT 128 so that the fifth HEMT 128 operates with little gain variation.

The voltage source 18 is connected to the resistor 116, the load resistors 132 and 134 and the capacitor 136. The load resistor 134 and the capacitor 136 are connected to a resistor 152 and the drain 148 of the fifth HEMT 128. The resistor 152 is connected to the node "A". The resistor 146 is connected to the node "B". The resistor 146 is connected to the reference resistor 122 and the resistor 144 which is connected to the gate 142 of the fifth HEMT 128. The source 150 of the fifth HEMT 128 is connected to the current source resistor 130 and a source 156 of the fourth HEMT 126. A drain 158 of the fourth HEMT 126 is connected to the load resistor 132. The gate 138 of the fourth HEMT 126 is connected at the node 114 to the resistors 116 and 118. The resistors 118,130 and 122 are connected to the voltage source 56.

A voltage drop from the drain 148 to the source 150 of the fifth HEMT 128 is defined as follows:

$$V_{DS} = I_{120} \cdot R_{146} + V_{GS2} + V_{GS5} \quad [4]$$

where $I_{120}$ is the regulated current indicated by the arrow 120, $R_{146}$ is the resistance value of the resistor 146, $V_{GS5}$ is a voltage drop from the gate 142 to the source 150 of the fifth HEMT 128, and $V_{GS2}$ is a voltage drop from the gate 44 to the source 42 of the second HEMT 14. As can be appreciated, the resistance value of the resistor 146 must be adjusted to ensure proper operation of the bias regulating circuit 104.

The bias regulation circuit 104 works for both depletion and enhancement mode HEMTs. The resistor 144 and the resistor 152 are used as AC chokes to isolate the bias regulation circuit 104 from the HEMT amplifier 100 in FIG. 5. Since gate current is negligible, there is a negligible voltage drop across the resistors 144 and 152. The resistance value of the resistors 144 and 152 affect noise performance of the HEMT amplifier if the resistance value are not large enough.

Figure 6A:
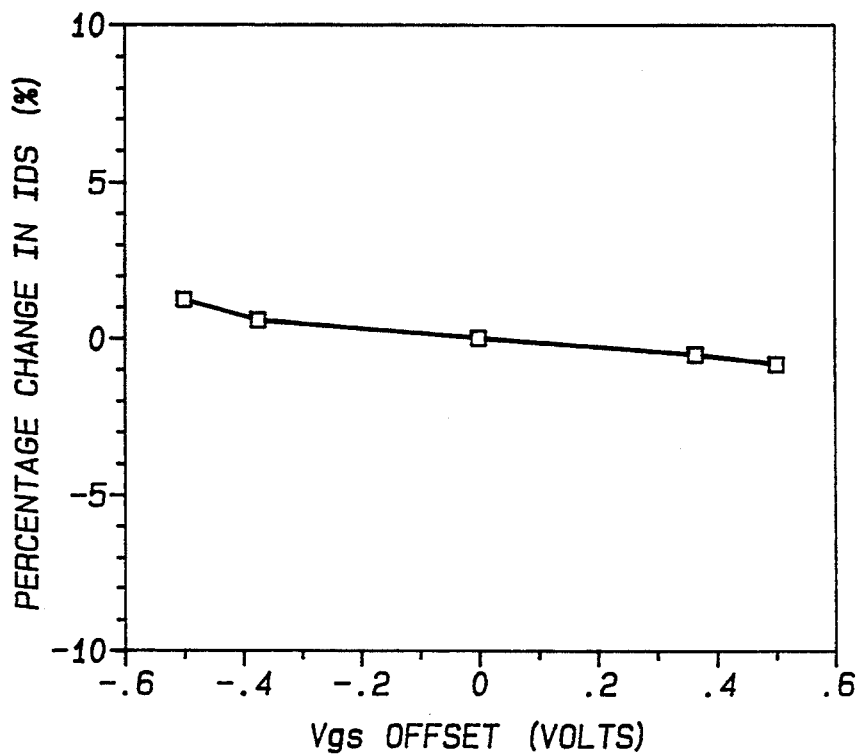
FIG. 6A is a graph of percent variation in regulated current as a function of variations in threshold voltage for the bias regulating circuit of FIG. 4 connected to the HEMT amplifier of FIG. 5.

FIG. 6A illustrates a simulated percentage change in a nominal bias current $I_{120}(I_{ds})$ indicated by arrow 120 of the bias regulating circuit 104 of FIG. 4 connected to the HEMT amplifier 100 of FIG. 5, as a function of a threshold offset voltage of the HEMT transistor. Using the bias regulating circuit 104 in conjunction with a HEMT transistor, the HEMT bias current can be regulated to within ±2% of the nominal bias current $I_{ds}$ for a ±0.5 volt variation about the nominal threshold voltage. The threshold variation of the HEMT is related to the inherent physical nature of the HEMT device fabrication process and material growth. The resulting variation in the threshold voltage presents a need for regulated self-biasing schemes. A relationship between percentage current regulation as a function of threshold variations and design parameters such as supply rail voltage and resistor values is given below for the bias regulating circuit 104:

$$\frac{\Delta I_{ds}}{I_{ds}} = \frac{1 + g_{m128} R_{134} \left( \frac{R_{122}}{R_{146} + R_{122}} \right) \frac{\Delta V_{gs}}{V_{ref}}}{1 + g_{m128} R_{134} \left( \frac{R_{122}}{R_{146} + R_{122}} \right)\left( 1 - \frac{\Delta V_{gs}}{V_{ref}} \right)} \quad [5]$$

where $\Delta V_{gs}$ is the threshold variation of the HEMT transistors. $I_{ds}$ is the nominal bias current, gm128 is a transconductance of HEMT 128, $R_{134}$ is the load resistor 134, $R_{122}$ is the source reference resistor 122, $R_{146}$ is the $R_{Vds}$ resistor 146, $V_{ref}$ is the reference voltage, and $\Delta I_{ds}$ is the change in $I_{ds}$ due to change in threshold voltage $\Delta V_{gs}$. The percentage change in $I_{ds}$ is then defined by equation [2].

Figure 6B:
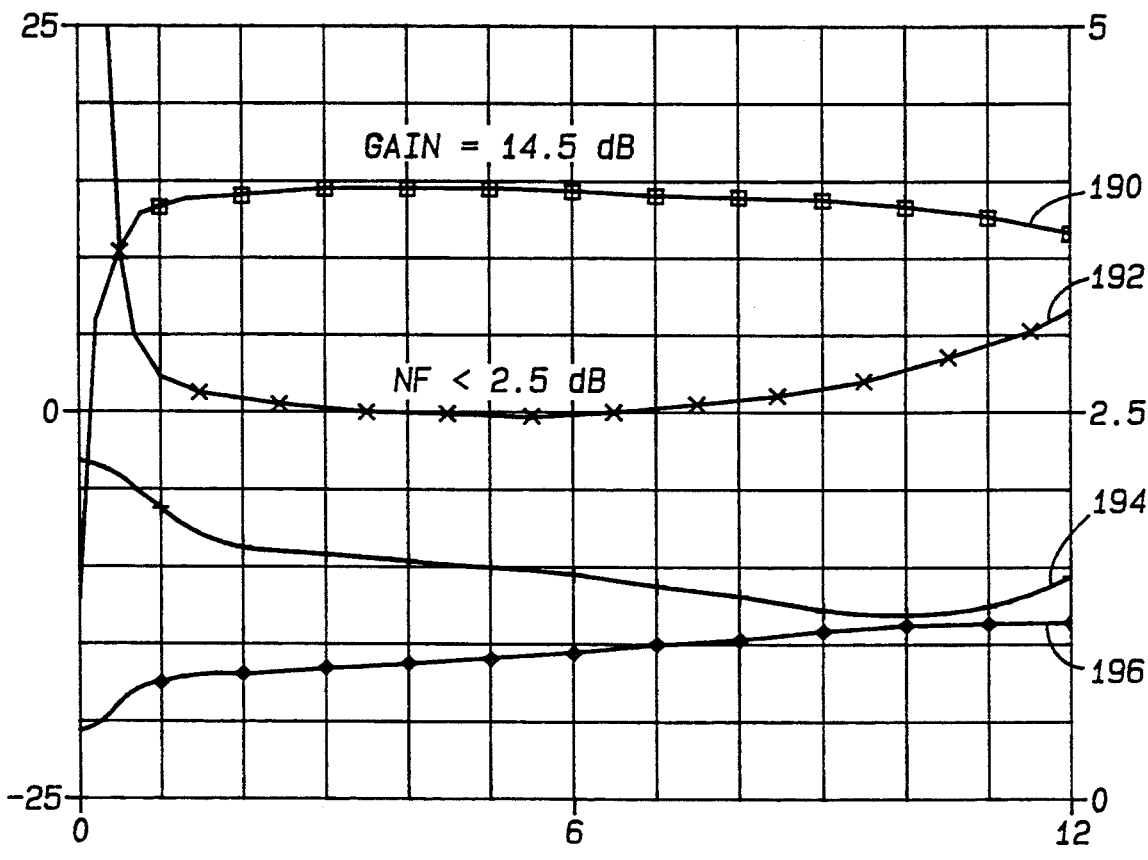
FIG. 6B is a graph of gain, noise figure and return-loss performance of the bias regulating circuit of claim 4 connected to the HEMT amplifier of FIG. 5.

In FIG. 6B, the gain, noise figure and return-loss performance of the HEMT amplifier 100 in FIG. 5 integrated with the bias regulation circuit 104 of FIG. 4, is shown. Plotted curve 190 illustrates a nominal gain of about 14.5 dB and plotted curve 192 illustrates a noise figure of about 2.5 dB. The amplifier operates from 1–12 GHz. The low end of the bandwidth is limited by the bypass capacitor 102 which bypasses the bias regulation circuit 104.

Plotted curve 194 illustrates return-loss of the input node 52. Return-loss is a measure of amplitude matching of a node to a 50 ohm impedance. Return-loss less than −10 dB is typically considered good. Plotted curve 194 illustrates return-loss of the input node 52. Plotted curve 196 illustrates return-loss of the output node 66.

Figure 7:
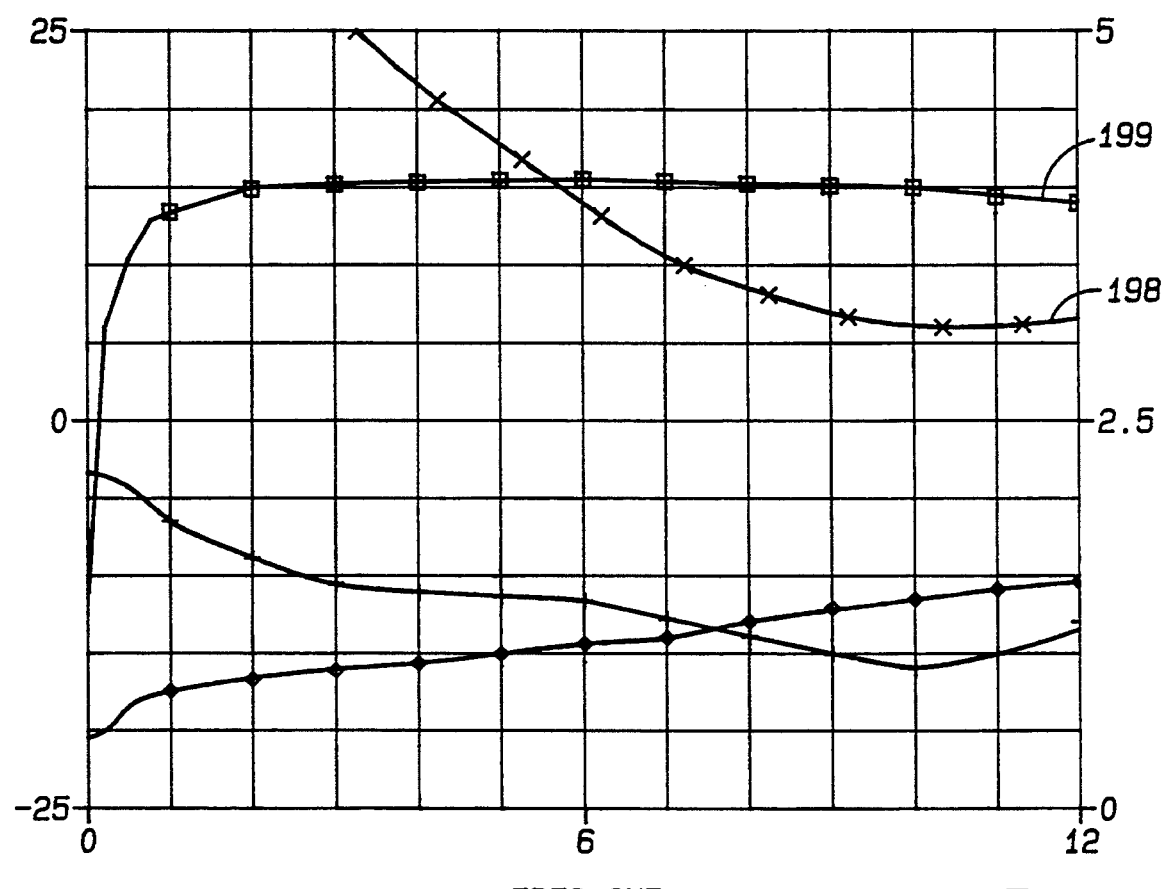
FIG. 7 is a graph of stability and gain performance of the bias regulating circuit of FIG. 4 connected to the HEMT amplifier of FIG. 5.

In FIG. 7, plotted curve 198 illustrates stability and plotted curve 199 illustrates gain performance of the bias regulation circuit 104 and the second low noise self-bias HEMT amplifier 100. The bias regulation circuit 104 and the second low noise self-bias HEMT amplifier 100 are unconditionally stable.

Figure 8:
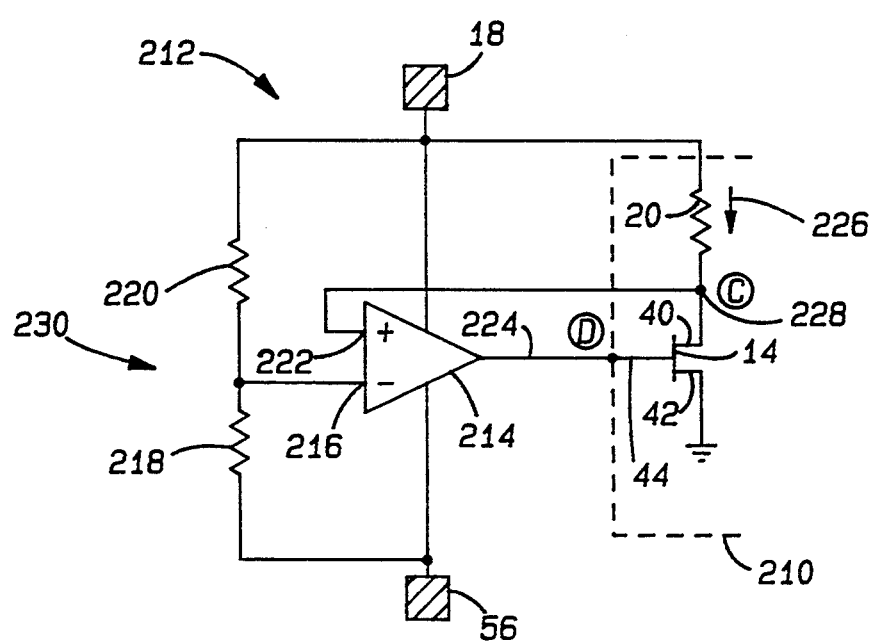
FIG. 8 is a simplified electrical schematic of an alternate bias regulating circuit for generating a positive current at a having a HEMT according to a third embodiment of the present invention.
Figure 9:
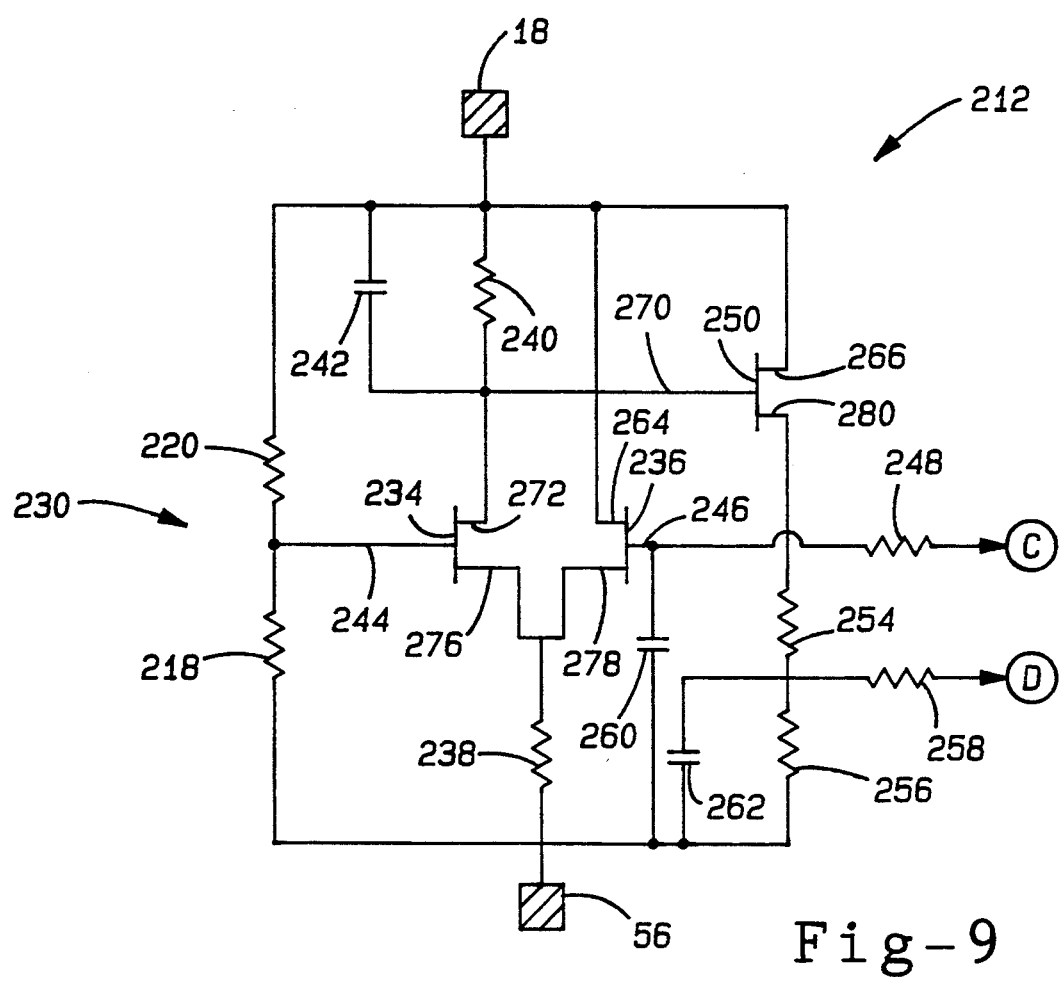
FIG. 9 is a detailed electrical schematic of the bias regulating circuit of FIG. 8.
Figure 10:
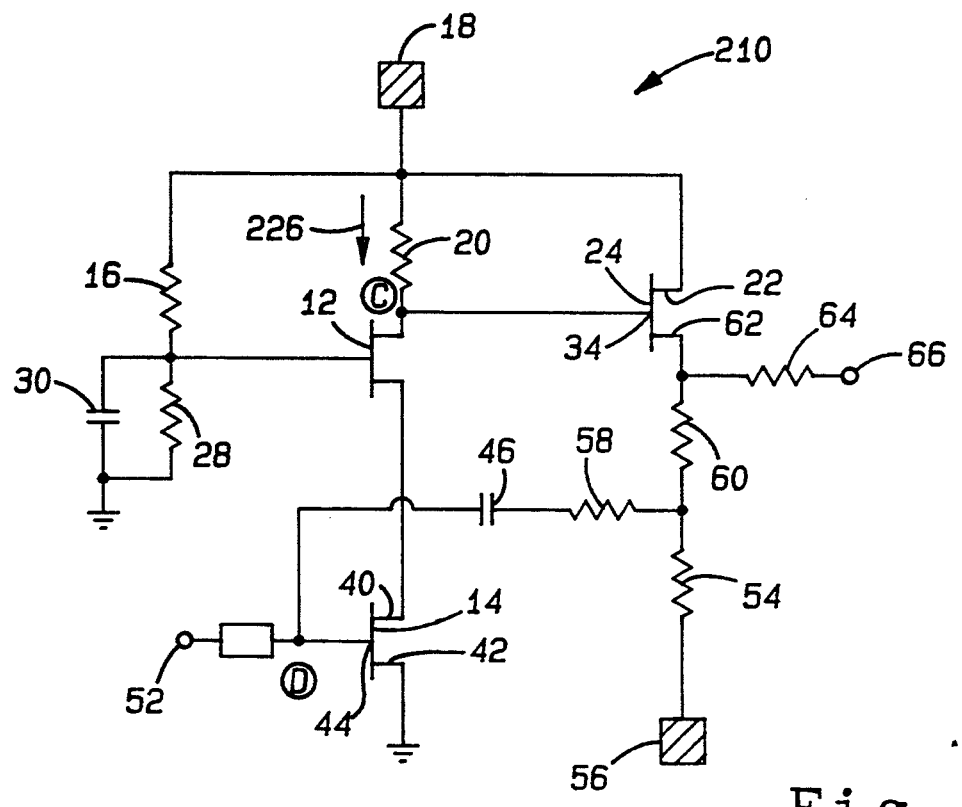
FIG. 10 is a detailed electrical schematic of a HEMT amplifier connected to the bias regulating circuit of FIG. 9.

FIGS. 8–12 illustrate an alternate bias regulating circuit for generating a positive current at a drain of HEMT according to a third embodiment of the present invention. FIG. 10 is an electrical schematic of a third low noise self-biased HEMT amplifier 210 is shown. In FIG. 9, an electrical schematic of a bias regulation circuit 212 is shown. In FIG. 8, a simplified electrical schematic of the bias regulation circuit 212 of FIG. 9 is shown.

Referring to FIG. 8, the bias regulation circuit 212 includes a HEMT pseudo-operational amplifier 214 connected to the voltage sources 18 and 56. An inverting input of 216 of the op-amp 214 is connected to a voltage divider including first and second resistors 218 and 220. The resistor 220 is connected to the voltage source 18 and the resistor 218 is connected to the voltage source 56. A non-inverting input 222 of the op-amp 214 is connected to the drain 40 of the second HEMT 14. An output 224 of the op-amp 214 is connected to the gate 44 of the second HEMT 14.

The regulation bias circuit 212 provides a regulated positive current (see arrow 226) at the drain 40 of the second HEMT 14. Since the op-amp 214 has negative feedback via the resistor 218, a voltage is regulated on one side (node 228 of the load resistor 20) to fix the regulated positive current (indicated by arrow 226) through the load resistor 20. A regulated reference voltage $V_{REF}$ is defined by a voltage divider network including the resistors 218 and 220. The regulated positive current indicated by arrow 226 is equal to:

$$I_{226} = \frac{V_D - V_{REF}}{R_{20}} \quad [6]$$

where $V_D$ is equal to a voltage supplied by the voltage source 18, $V_{REF}$ is equal to the regulated reference voltage at the inverting input 216 of the op-amp 214, and $R_{20}$ is equal to the resistance value of the resistor 20.

In FIG. 9, the bias regulation circuit 212 is shown in detail. The bias regulation circuit 212 is connected at points "C" and "D" in FIG. 10. The op-amp 214 is replaced by a differential transistor pair including sixth and seventh HEMT 234 and 236, a current source resistor 238, and a load resistor 240. A voltage gain of the differential transistor pair including the sixth and seventh HEMT 234 and 236 is set by $(g_m) \cdot (R_L)$. As the gain increases, the bias regulation circuit 212 becomes less sensitive to threshold voltage variations.

A capacitor 242 is used for frequency compensation of the differential transistor pair including the sixth and seventh HEMT 234 and 236. A voltage reference ($V_{REF}$) at a gate 244 of the sixth HEMT 234 is determined by the resistance value of the resistors 218 and 220 forming the voltage divider network 230. Because of a negative feedback orientation of the sixth and seventh HEMT 234 and 236, the differential transistor pair adjusts current such that a voltage at a gate 246 of the seventh HEMT 236 is the same as the reference voltage at the gate 244 of the sixth HEMT 234.

Since a current into the gate 246 of the seventh HEMT 236 is negligible (less than 10 micro-amps), there is a negligible voltage drop across a resistor 248. Therefore, the node "C" is at the reference voltage. An eighth HEMT 250 is a buffer source follower which drives the gate 44 of the second HEMT 14 through a voltage divider including resistors 254 and 256 and an isolation resistor 258. Bypass capacitors 260 and 262 isolate the regulation bias circuit 212 from the amplifier 210. The capacitance values of the bypass capacitors 260 and 262 affect low frequency gain roll-off and noise performance.

The voltage source 18 is connected to the resistor 220, the capacitor 242, the load resistor 240, a drain 264 of the seventh HEMT 236, and a drain 266 of the eighth HEMT 250. The capacitor 242 is also connected to the load resistor 240, a gate 270 of the eighth HEMT 250 and a drain 272 of the sixth HEMT 234.

The resistor 220 is also connected to the resistor 218 and the gate 244 of the sixth HEMT 234. The resistor 218 is connected to the current source resistor 238, the capacitor 260, a bypass capacitor 262, the resistor 256, and the voltage source 256. The resistor 238 is connected to a source 276 of the sixth HEMT 234 and a source 278 of the seventh HEMT 236.

The gate 246 of the seventh HEMT 236 is connected to the capacitor 260 and the resistor 248. The resistor 248 is connected to the node "C". The bypass capacitor 262 is connected to the resistors 254, 256 and 258. The resistor 258 is connected to the node "D". The resistor 254 is connected to a source 280 of the eighth HEMT 250.

The bias regulation circuit 212 provides the regulated positive current (arrow 226 in FIGS. 8 and 10) as defined above in connection with FIG. 8. The bias regulation circuit 212 works for both depletion and enhancement mode HEMTs. The resistors 248 and 258 are used as AC chokes to isolate the bias regulation circuit 212 from the amplifier 210. If low resistance values are used for the resistors 248 and 258, the noise performance of the amplifier 210 is adversely effected.

Figure 11A:
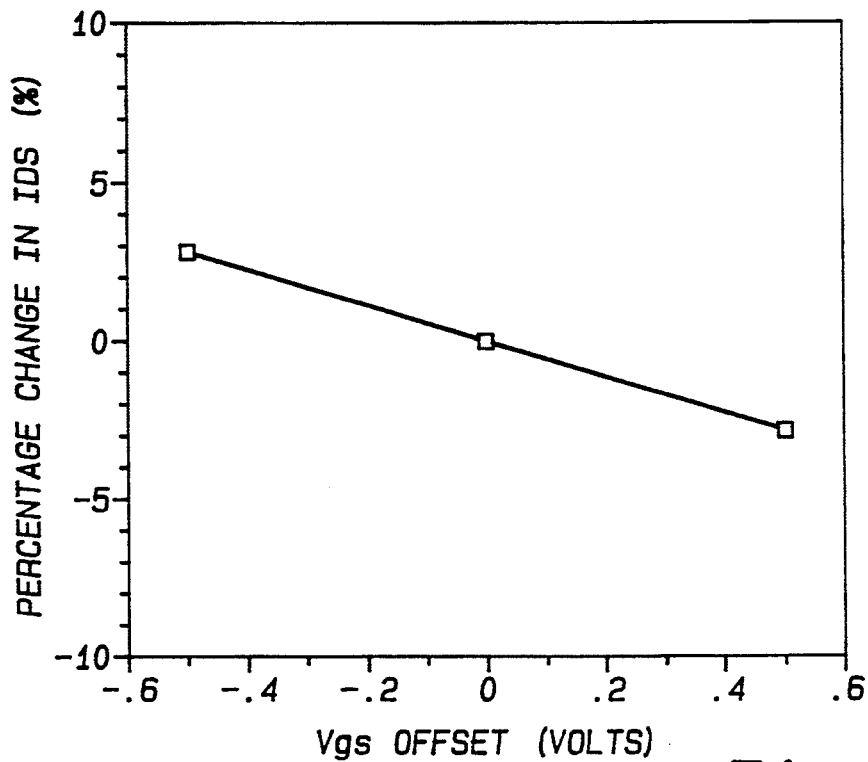
FIG. 11A is a graph of percent variation in regulated current as a function of variations in threshold voltage for the bias regulating circuit of FIG. 9 connected to the HEMT amplifier of FIG. 10.

FIG. 11A illustrates a simulated percentage change in a nominal bias current $I_{226}$ ($I_{ds}$) indicated by arrow 226 in the FIG. 8, produced by the bias regulating circuit 212 of FIG. 9 connected to the amplifier 210 of FIG. 10 as a function of the threshold offset voltage of the HEMT transistor. Using the bias regulating circuit 212 in conjunction with a HEMT transistor, the HEMT bias current can be regulated to within ±3% of the nominal bias current for a ±0.5 volt variation about the nominal threshold voltage. As mentioned in the discussion, the threshold variation of the HEMT is related to the inherent physical nature of the HEMT device fabrication process and material growth. The resulting variation in the threshold voltage elicits a need for regulated self-biasing schemes. A relationship relating percentage current regulation as a function of threshold variations and design parameters such as supply rail voltage and resistor values is given below for the bias circuit 212:

$$\frac{\Delta I_{ds}}{I_{ds}} = \left| \frac{1 + \left[ g_{m234} R_{240} \left( \frac{R_{256}}{R_{256} + R_{254}} \right) g_{m14} R_{20} \left( 1 - \frac{\Delta V_{gs}}{V_{18} - V_{254}} \right) \right] - \left[ g_{m234} R_{240} \left( \frac{R_{256}}{R_{256} - R_{254}} \right) g_{m14} R_{20} \right]}{1 + g_{m234} R_{240} \left( \frac{R_{256}}{R_{256} + R_{254}} \right) g_{m14} R_{20} \left( 1 - \frac{\Delta V_{gs}}{V_{18} - V_{56}} \right)} \right| \quad [7]$$

where $\Delta V_{gs}$ is the threshold variation of the HEMT transistor, $I_{ds}$ is the nominal bias current, gm234 is a transconductance of HEMT 234, $R_{240}$ is a resistance value of load resister 240, $R_{256}$ is a resistance value of the resistor 256, $R_{254}$ is a resistance value of the resistor 234, $g_{m14}$ is a transconductance of HEMT 14, $R_{20}$ is a resistance value of the load resistor 20, $V_{20}$ is a resistance value of the load resistor 20, $V_{18}$ is a voltage of the positive supply voltage 18, $V_{56}$ is a voltage of the negative supply voltage 56, and $\Delta I_{ds}$ is change in $I_{ds}$ due to change in threshold voltage $\Delta V_{gs}$. Percent change in $I_{ds}$ is defined by the equation [2].

Figure 11B:
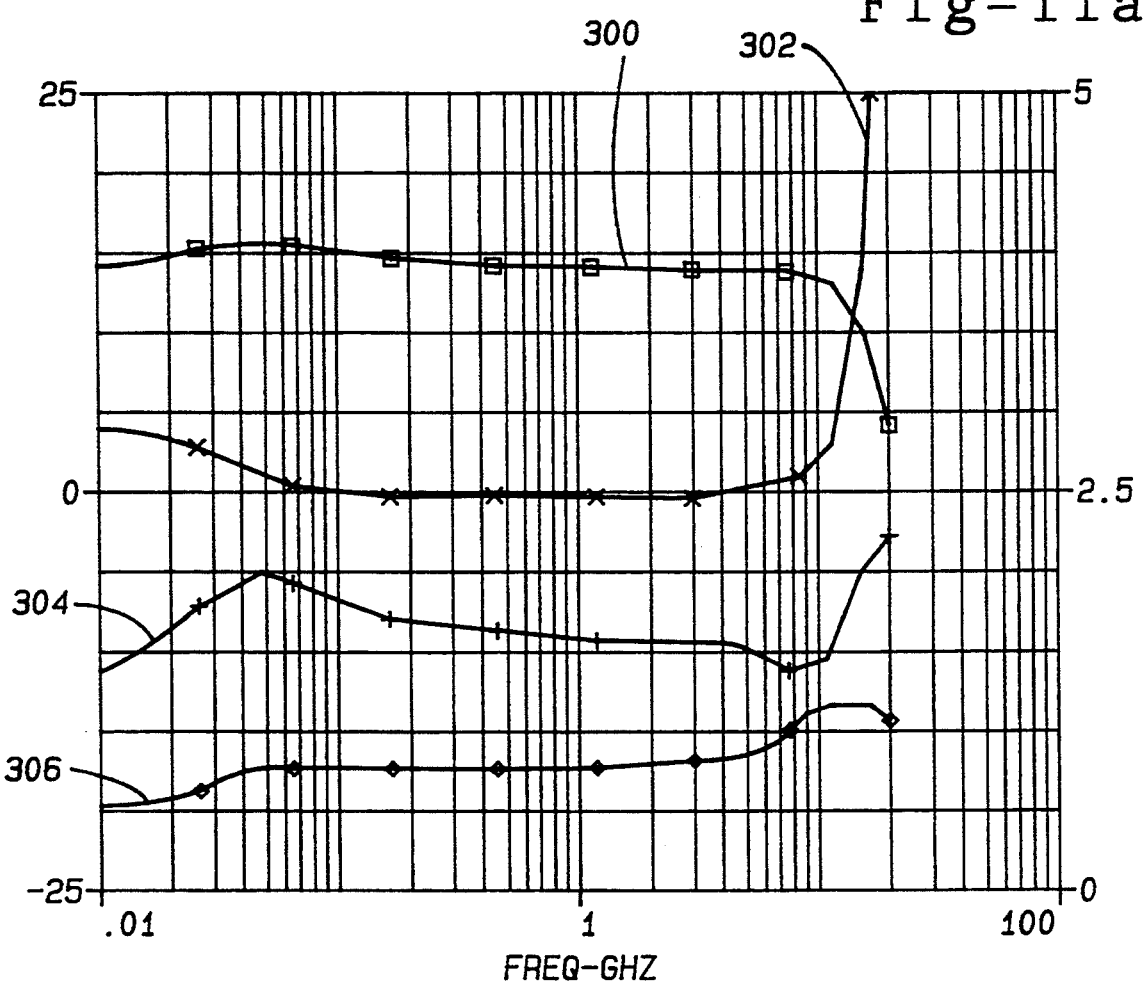
FIG. 11B is a graph of gain, noise figure and return-loss performance of the bias regulating circuit of FIG. 9 and connected to the HEMT amplifier of FIG. 10.

In FIG. 11B, the gain, noise figure and return-loss performance of the amplifier 210 integrated with the bias regulation circuit 212 in FIG. 9, is shown. Plotted curve 300 illustrates a nominal gain of about 14.5 dB and plotted curve 302 illustrates a noise figure of about 2.5 dB. The amplifier 210 operates from 100 MHz to 12 GHz. Plotted curve 304 illustrates return-loss measured at the input node 52 for the amplifier 210. Plotted curve 306 illustrates return-loss measured at the output node 66 of the amplifier 210.

Figure 12:
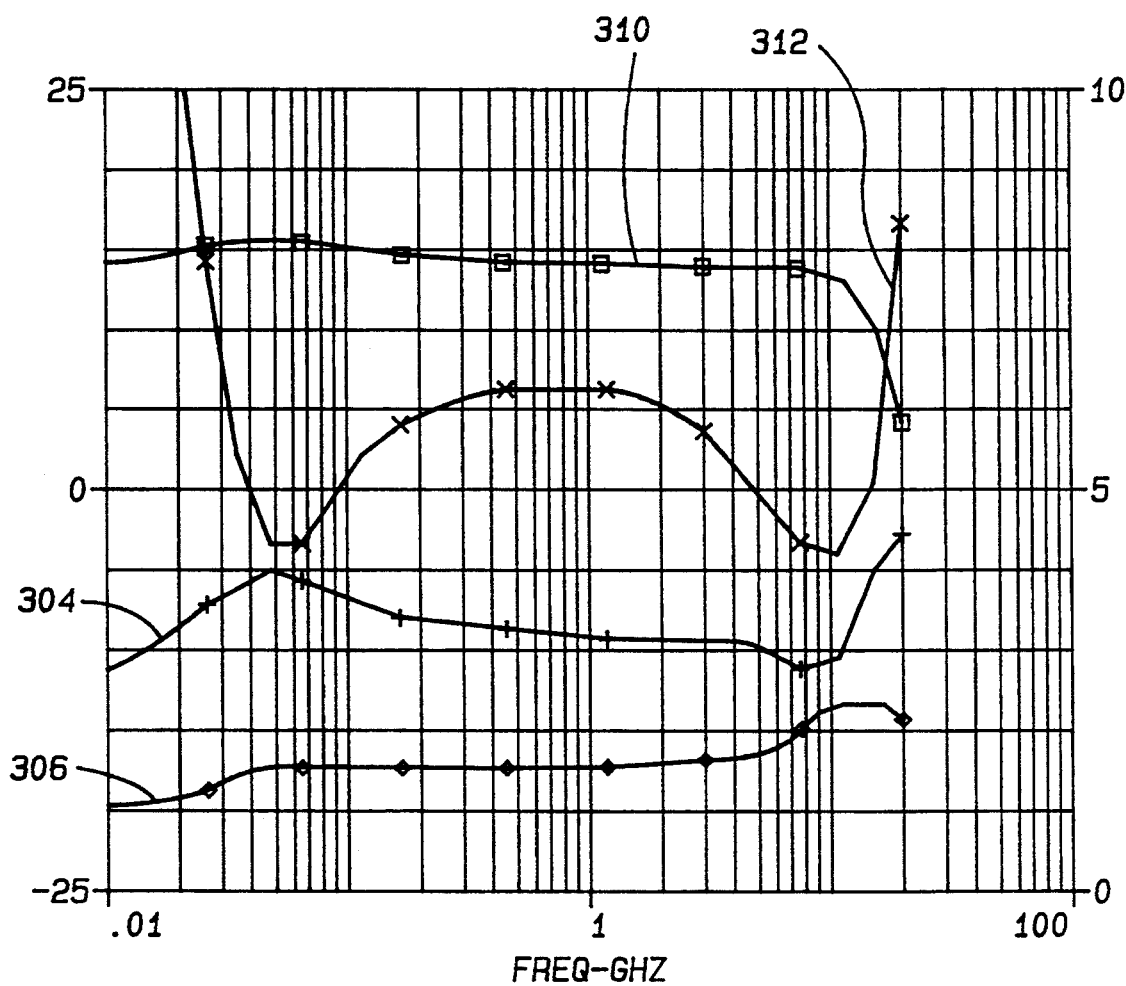
FIG. 12 is a graph of stability and gain performance of the bias regulating circuit of FIG. 9 and the HEMT amplifier of FIG. 10.

In FIG. 12, plotted curve 312 illustrates stability and plotted curve 310 illustrates gain performance of the amplifier 210 biased by the bias regulation circuit 212. The amplifier 210 and the bias regulation circuit 212 are unconditionally stable.

As can be appreciated from the foregoing, the self-biased HEMT amplifiers of the present invention provides large bandwidth, high gain, and low noise performance. The amplifier can be fabricated using compact MMIC. More particularly, the amplifier can be fabricated using a self-biased regulation circuit and HEMTs which are monolithically integrated, saving both cost and size.

The various advantages of the present invention will become apparent to those skilled in the art after a study of the foregoing specification and following claims.

What is claimed is:

1. A bias regulating circuit for generating a negative current at a source of a first HEMT, comprising:
   second and third HEMTs monolithically integrated with said first HEMT and each including a gate, a source, and a drain, wherein said source of said third HEMT is connected to the source of said second HEMT;
   a gate resistor having one end connected to the gate of the third HEMT;
   a first resistor having one end connected to the drain of the third HEMT and an opposite end connected to a gate of the first HEMT; and
   a second resistor having one end connected to an opposite end of the gate resistor, and an opposite end connected to the source of the first HEMT.

2. The bias regulating circuit of claim 1 further including:
   a first voltage source;
   a first load resistor having one end connected to said first voltage source and an opposite end connected to said drain of said second HEMT; and
   a second load resistor having one end connected to said first voltage source and opposite end connected to said drain of said third HEMT.

3. The bias regulating circuit of claim 2 further including:
   a second voltage source;
   a third resistor having one end connected to said first voltage source and an opposite end connected to the gate of said second HEMT; and
   a fourth resistor having one end connected to said second voltage source and an opposite end connected to said source of said second HEMT and said source of said third HEMT.

4. The bias regulating circuit of claim 3 further including:
   a reference resistor having one end connected to said second voltage source and an opposite end connected to the opposite end of the gate resistor, whereby said negative current is generated across said reference resistor.

The bias regulating circuit of claim 4 further including:

5. a first compensation capacitor having one end connected to said first voltage source and an opposite end connected to drain of said third HEMT.

6. The bias regulating circuit of claim 1 wherein said second resistor provides a voltage drop across said drain and the source of the third HEMT to stabilize gain of said third HEMT.

7. The bias regulating circuit of claim 1 wherein said first HEMT is connected in an amplifier network.

8. The bias regulating circuit of claim 7 wherein the amplifier network further includes:
   fourth and fifth HEMTs monolithically integrated with said first, second and third HEMTs and each including a gate, a source, and a drain, wherein the source of said fourth HEMT is connected to the drain of the first HEMT and the drain of the fourth HEMT is connected to the gate of the fifth HEMT; and
   an amplifier input node connected to the gate of the first HEMT.

9. The bias regulating circuit of claim 8 wherein the amplifier network further includes:
   an amplifier output node connected to a matching resistor which is connected to the source of the first HEMT; and
   a third load resistor having one end connected to the drain of the fourth HEMT and the gate of the first HEMT, and an opposite end connected to the drain of the fifth HEMT and the first voltage source.

10. The bias regulating circuit of claim 9 wherein the amplifier network further includes:

current source means for biasing said source of said fifth HEMT and including fifth and sixth resistors, wherein one end of said fifth resistor is connected to said source of said fifth HEMT, an opposite end of said fifth resistor is connected to one end of said sixth resistor, and an opposite end of said sixth resistor is connected to said second voltage source.

11. The bias regulating circuit of claim 10 wherein said amplifier network further includes:
seventh and eighth resistors, wherein said seventh resistor has one end connected to said first voltage source and an opposite end of said seventh resistor is connected to one end of said eighth resistor and the gate of said fourth HEMT.

12. The bias regulating circuit of claim 11 wherein said amplifier network further includes:
a bypass capacitor connected to the opposite end of said seventh resistor and said one end of said eighth resistor.

13. The bias regulation circuit of claim 12 wherein said amplifier network further includes:
a blocking capacitor having one end connected to the gate of said first HEMT; and
a ninth resistor having one end connected to an opposite end of said blocking capacitor, and an opposite end connected to said opposite end of said fifth resistor,
wherein said blocking capacitor and said ninth resistor form a feedback path to said gate of said first HEMT.

14. A bias regulating circuit for generating a negative current at a source of a first HEMT of an amplifier network. comprising:
second and third HEMTs monolithically integrated with said first HEMT and each including a gate, a source, and a drain, wherein said source of said third HEMT is connected to the source of said second HEMT;
a gate resistor having one end connected to the gate of the third HEMT;
a first resistor having one end connected to the drain of the third HEMT and an opposite end connected to a gate of the first HEMT;
a second resistor having one end connected to an opposite end of the gate resistor, and an opposite end connected to the source of the first HEMT;
a first voltage source;
a first load resistor having one end connected to said first voltage source and an opposite end connected to said drain of said second HEMT;
a second load resistor having one end connected to said first voltage source and opposite end connected to said drain of said third HEMT;
a second voltage source;
a third resistor having one end connected to said first voltage source and an opposite end connected to the gate of said second HEMT;
a fourth resistor having one end connected to said second voltage source and an opposite end connected to said source of said second HEMT and said source of said third HEMT;
a reference resistor having one end connected to said second voltage source and an opposite end connected to the opposite end of the gate resistor; and
a first capacitor having one end connected to said first voltage source and an opposite end connected to drain of said third HEMT.

15. A bias regulating circuit for generating a positive current at drain of a first HEMT, comprising:
second and third HEMT monolithically integrated with said first HEMT and each including a gate, a source and a drain, wherein the source of said second HEMT is connected to the source of said third HEMT;
buffer HEMT monolithically integrated with said first HEMT and including a gate, a source and a drain, wherein said gate of said buffer HEMT is connected to the drain of the second HEMT;
voltage divider network including first and second resistors, wherein one end of said first resistor is connected to said source of said buffer HEMT, and an opposite end of said first resistor is connected to said one end of said second resistor;
a first gate resistor having one end connected to said gate of said third HEMT; and
a second gate resistor having one end connected to said opposite end of said first resistor and an opposite end connected to said gate of said first HEMT.

16. The bias regulating circuit of claim 15 further including:
a first voltage supply connected to said drain of said third HEMT and said drain of said buffer HEMT;
a second voltage supply connected to an opposite end of said second resistor.

17. The bias regulating circuit of claim 16 further including:
a first load resistor having one end connected to said first voltage supply and an opposite end connected to said drain of said second HEMT, wherein said first load resistor provides closed loop voltage gain.

18. The bias regulating circuit of claim 17 further including:
third and fourth resistors, wherein one end of said third resistor is connected to said first voltage supply, an opposite end of said third resistor is connected to said gate of said second HEMT, one end of said fourth resistor is connected to said gate of said second HEMT and an opposite end is connected to said second voltage supply.

19. The bias regulating circuit of claim 18 further including:
a current source resistor having one end connected to said source of said second HEMT, and an opposite end connected to said second voltage supply.

20. The bias regulating circuit of claim 19 further including:
a compensation capacitor having one end connected to said first voltage supply and an opposite end connected to said drain of said second HEMT.

21. The bias regulating circuit of claim 20 further including:
a first bypass capacitor having one end connected to said gate of said third HEMT and an opposite end connected to said second voltage supply; and
a second bypass capacitor having one end connected to said opposite end of said first resistor and an opposite end connected to said second voltage supply.

22. The bias regulating circuit of claim 21 wherein said first HEMT is connected in an amplifier network.

23. The bias regulating circuit of claim 22 wherein said amplifier network further includes:
a fourth monolithically integrated HEMT including a gate, a source and a drain, wherein said source of said fourth HEMT is connected to said drain of said first HEMT, and wherein an opposite end of said first gate resistor is connected to said drain of said fourth HEMT.

24. The bias regulating circuit of claim 23 wherein said amplifier network further includes:
a fifth resistor having one end connected to said gate of said fourth HEMT and an opposite end connected to said first voltage supply; and
a sixth resistor having one end connected to said one end of said fifth resistor.

25. The bias regulating circuit of claim 24 wherein said amplifier network further includes:
a third bypass capacitor having one end connected to said one end of said fifth resistor and an opposite end connected to an opposite end of said sixth resistor.

26. The bias regulating circuit of claim 25 wherein amplifier network further includes:
a second lead resistor having one end connected to said first voltage supply and an opposite end connected to said drain of said fourth HEMT, wherein said second lead resistor provides said positive current.

27. The bias regulating circuit of claim 26 wherein said amplifier network further includes:
a fifth monolithically integrated HEMT including a gate, a source and a drain wherein said gate is connected to said drain of said fourth HEMT and said drain is connected to said first voltage supply.

28. The bias regulating circuit of claim 27 wherein said amplifier network further includes:
an amplifier output node; and
a matching resistor connected between said amplifier output node and said source of said fifth HEMT.

29. The bias regulating circuit of claim 28 wherein said amplifier network further includes:
current source means for biasing said source of said fifth HEMT and including seventh and eighth resistors, wherein one end of said seventh resistor is connected to said source of said fifth HEMT, an opposite end of said seventh resistor is connected to one end of said eighth resistor, and an opposite end of said eighth resistor is connected to said second voltage source.

30. The bias regulating circuit of claim 29 wherein said amplifier network further includes:
a blocking capacitor having one end connected to said gate of said first HEMT; and
a ninth resistor having one end connected to said one end of said eighth resistor and an opposite end connected to an opposite end of said blocking capacitor.

31. The bias regulating circuit of claim 30 wherein said amplifier network further includes:
an amplifier input node; and
a microstrip having one end connected to said input node and an opposite end connected to said gate of said first HEMT.

32. A bias regulating circuit for generating a positive current at a drain of a first HEMT of an amplifier network, comprising:
second and third HEMTs monolithically integrated with said first HEMT and each including a gate, a source and a drain, wherein the source of said second HEMT is connected to the source of said third HEMT;
buffer HEMT monolithically integrated with said first HEMT and including a gate, a source and a drain, wherein said gate of said buffer HEMT is connected to the drain of the second HEMT;
voltage divider network including first and second resistors, wherein one end of said first resistor is connected said source of said buffer HEMT, and an opposite end of said first resistor is connected to one end of said second resistor;
a first gate resistor having one end connected to said gate of said third HEMT;
a second gate resistor having one end connected to said opposite end of said first resistor and an opposite end connected to said gate of said first HEMT;
a first voltage supply connected to said drain of said third HEMT and said drain of said buffer HEMT;
a second voltage supply connected to an opposite end of said second resistor;
a first load resistor having one end connected to said first voltage supply and an opposite end connected to said drain of said second HEMT;
third and fourth resistors, wherein one end of said third resistor is connected to said first voltage supply, an opposite end of said third resistor is connected to said gate of said second HEMT, one end of said fourth resistor is connected to said gate of said second HEMT and an opposite end is connected to said second voltage supply;
a current source resistor having one end connected to said source of said second HEMT and said source of said third HEMT, and an opposite end connected to said second voltage supply;
a compensation capacitor having one end connected to said first voltage supply and an opposite end connected to said drain of said second HEMT;
a first bypass capacitor having one end connected to said gate of said third HEMT and an opposite end connected to said second voltage supply; and
a second bypass capacitor having one end connected to said opposite end of said first resistor and an opposite end connected to said second voltage supply.

33. A resistive self-biased low noise amplifier comprising:
first, second and third HEMTs each including a gate, a source, and a drain, wherein the source of said first HEMT is connected to the drain of the second HEMT, and the drain of the first HEMT is connected to the gate of the third HEMT;
an amplifier input node connected to the gate of the second HEMT;
an amplifier output node connected to a matching resistor which is connected to the source of the third transistor;
a load resistor having one end connected to the drain of the first HEMT and the gate of the third HEMT, and an opposite end connected to the drain of the third HEMT;
current source means for biasing said source of said third HEMT and including a first voltage source connected to first and second resistors, wherein one end of said first resistor is connected to said source of said third HEMT, an opposite end of said first resistor is connected to one end of said second resistor, and an opposite end of said second resistor is connected to said first voltage source;
first voltage divider network including third and fourth resistors, wherein one end of said third resistor is connected to said drain of said first HEMT, an opposite end of said third resistor is connected to said gate of said second HEMT, an end of said fourth resistor is connected to said opposite end of said third resistor, and an opposite end of said fourth resistor is connected to said first voltage source;

second voltage divider network including fifth and sixth resistors, wherein one end of said fifth resistor is connected to said load resistor, an opposite end of said fifth resistor is connected to said gate of said first HEMT, and one end of said sixth resistor is connected to said gate of said first HEMT; and a bypass capacitor having one end connected to said gate of said first HEMT and an opposite end connected to opposite end of said sixth resistor.

* * * * *